United States Patent
Wang et al.

(10) Patent No.: US 9,696,371 B2
(45) Date of Patent: Jul. 4, 2017

(54) TEST METHOD AND SYSTEM FOR CUT-IN VOLTAGE

(71) Applicant: CSMC TECHNOLOGIES FAB2 CO., LTD., Wuxi New District (CN)

(72) Inventors: Ming Wang, Wuxi New District (CN); Xiaoqian Lian, Wuxi New District (CN); Yaojun Lin, Wuxi New District (CN); Wenhui Xu, Wuxi New District (CN); Hanshun Chen, Wuxi New District (CN)

(73) Assignee: CSMC Technologies Fab2 Co., Ltd., Wuxi New District, Jiangsu (CN)

( * ) Notice: Subject to any disclaimer, the term of this patent is extended or adjusted under 35 U.S.C. 154(b) by 38 days.

(21) Appl. No.: 14/759,370

(22) PCT Filed: Dec. 31, 2013

(86) PCT No.: PCT/CN2013/091203
§ 371 (c)(1),
(2) Date: Jul. 6, 2015

(87) PCT Pub. No.: WO2014/114180
PCT Pub. Date: Jul. 31, 2014

(65) Prior Publication Data
US 2015/0338455 A1  Nov. 26, 2015

(30) Foreign Application Priority Data

Jan. 23, 2013 (CN) .......................... 2013 1 0024912

(51) Int. Cl.
*G01R 31/02* (2006.01)
*G01R 31/26* (2014.01)

(52) U.S. Cl.
CPC ..... *G01R 31/2621* (2013.01); *G01R 31/2623* (2013.01)

(58) Field of Classification Search
CPC ............ G01R 31/2621; G01R 31/2623; G01R 31/275; G01R 31/2884; G01R 31/2608;
(Continued)

(56) References Cited

U.S. PATENT DOCUMENTS 5,537,054 A * 7/1996 Suzuki ................... G09G 3/006
                                               324/762.01
6,586,921 B1 * 7/2003 Sunter ............ G01R 31/318552
                                               324/76.11
(Continued)

FOREIGN PATENT DOCUMENTS

CN        101118267      2/2008
CN        101155423      4/2008
(Continued)

OTHER PUBLICATIONS

International Search Report of PCT/CN2013/091203 and English translation, dated Mar. 20, 2014, 6 pages total.

*Primary Examiner* — Thang Le
(74) *Attorney, Agent, or Firm* — Hamre, Schumann, Mueller & Larson, P.C.

(57) ABSTRACT

A test method and system for cut-in voltage. The method comprises: coarse scanning of the cut-in voltage: a grid voltage, i.e., the cut-in voltage, is quickly determined when a drain terminal current is greater than a target current for the first time (100); accurate scanning of the cut-in voltage: a scanning step length is shortened continuously until the scanning step length is shorter than a preset step length, and each time the scanning step length is shortened, the scanning is conducted according to the current shortened scanning step length on the basis of the cut-in voltage determined in the former time, and then the cut-in voltage under the condition of the current shortened scanning step length is determined again (200). The scanning voltage is automatically increased or decreased by the test method and system through adding high resolution and high precision test conversion into a second scanning test, and therefore the testing of the cut-in voltage becomes more efficient and more accurate.

10 Claims, 3 Drawing Sheets

(58) Field of Classification Search
CPC .......... G01R 31/2614; G01R 31/2607; G01R 31/31924; G01R 31/3004; G01R 31/31922; G01R 31/318511; G01R 31/2831; G01R 31/318505
USPC .......... 324/762.01, 762.03, 762.05, 762.06, 324/762.09
See application file for complete search history.

(56) References Cited

U.S. PATENT DOCUMENTS

| | | | |
|---|---|---|---|
| 7,023,233 B1 | 4/2006 | Furukawa | |
| 2011/0310079 A1* | 12/2011 | Kim | G06F 3/0412 345/211 |
| 2012/0092037 A1* | 4/2012 | Yu | H01L 22/14 324/762.01 |
| 2013/0069925 A1* | 3/2013 | Lin | G09G 5/00 345/211 |
| 2014/0247067 A1* | 9/2014 | He | G01R 31/2621 324/762.09 |

FOREIGN PATENT DOCUMENTS

| | | |
|---|---|---|
| CN | 101275983 | 10/2008 |
| CN | 102004218 | 4/2011 |
| CN | 202083773 | 12/2011 |
| CN | 102313866 | 1/2012 |
| CN | 102385029 | 3/2012 |
| CN | 102608508 | 7/2012 |
| CN | 102692543 | 9/2012 |
| CN | 102707227 | 10/2012 |
| CN | 103105570 | 5/2013 |
| JP | 04-366777 | 12/1992 |

* cited by examiner

TEST METHOD AND SYSTEM FOR CUT-IN VOLTAGE

FIELD OF THE INVENTION

The present invention relates to semiconductor test field, and more particularly, relates to a test method and system for cut-in voltage of semiconductor product.

REARGROUND OF THE INVENTION

Field effect transistors includes junction field effect transistors and MOS field effect transistors, and are widely applied to various applications. Pinch-off voltage Vp and cut-in voltage Vth are critical direct current parameters of a field effect transistor. Generally, Vth indicates a cut-in voltage of an enhanced field effect transistor. In the enhanced field effect transistor, a voltage is applied to the gate electrode to conduct a inversion on the Si surface, and a certain voltage is applied to the drain electrode to cause a current flowing between the source electrode and the drain electrode. In a test process, the voltage on the gate electrode is scanned, and a test of the current between the source electrode and the drain electrode is conducted simultaneously. When the current on the drain electrode reaches a target current value (cut-in current), thus, the voltage on the gate electrode is deemed to be the cut-in voltage Vth.

At present, since the summary of developing a circuit design and the capability of controlling windows for process verification should be provided to client. The manufacture is required to provide the client a lot of mismatch data. Because the test accuracy significantly influences the mismatch test, thus it requires a much more accuracy for the mismatch test of the cut-in voltage than that of a normal test, so as to meet the demand of the test.

For current test method for cut-in voltage, a scanning is conducted on the gate electrode with a voltage increasing from 0 volts. The scanning step length is set, and the current on the drain electrode is measured. The target current value is set to be 1 μA. The drain electrode current and the target current are compared, when the drain electrode current reaches the target electrode current, the current cut-in voltage value is returned. Adopting such scanning mode, when the drain electrode current reaching the target current value is measured for one time, the test is terminated. If the set step length is too large, the test accuracy is significantly influenced. If the set step length is too small, the test efficiency is significantly influenced.

Because a lot of mismatch tests of cut-in voltage are conducted in the process verification and the process development stage. Therefore, the scanning range mode of the current cut-in voltage test method is one time scanning. It cannot be reasonably set to meet the requirements of the accuracy and the efficiency of the mismatch test.

SUMMARY OF THE INVENTION

Accordingly, it is necessary for the invention to provide a test method and system for cut-in voltage, which is capable of conducting an accurate and efficient test, meeting a requirement of cut-in voltage test such as a mismatch test requiring a very high accuracy.

The invention discloses a test method for cut-in voltage, including:

step A, a coarse scanning of the cut-in voltage: determining a scanning cut-in voltage at a coarse scanning step length;

step B, an accurate scanning of the cut-in voltage: conducting a scanning taking a shortened scanning step length as a current scanning step length, which is on basis of the scanning cut-in voltage corresponding to previous scanning step length, and determining a scanning cut-in voltage corresponding to the shortened scanning step length; shortening the scanning step length continuously and conducting the scanning accordingly, until the previous scanning step length is shorter than a preset step length, and calculating the cut-in voltage according to the last scanning result;

wherein the scanning cut-in voltage is the minimum gate electrode voltage which allows a drain electrode current to be greater than a target current at the current scanning step length.

Preferably, step B specifically includes:

step B01, determining whether a previous scanning step length is greater than the preset step length, if the previous scanning step length is greater than or equal to the preset step length, then shortening the current scanning step length to obtain the current scanning step length; if the current scanning step length is less than the preset step length, then executing step B05; if else, executing step B02;

step B02, measuring the drain electrode current when the drain electrode voltage is the scanning cut-in voltage corresponding to the previous scanning step length, and comparing the drain electrode current to a target current, if the drain electrode current is less than the target current, executing step B03; if else, executing step B04;

step B03, increasing the gate electrode voltage step by step according to the current scanning step length, measuring the corresponding drain electrode current, until the drain electrode current is greater than or equal to the target current for the first time, then returning the current gate electrode voltage as the scanning cut-in voltage corresponding to the current scanning step length, simultaneously returning the drain electrode current corresponding to the scanning cut-in voltage, the maximum drain electrode current which is less than the target current in the scanning, the corresponding gate electrode voltage, and executing step B01;

step B04, decreasing the gate electrode voltage step by step according to the current scanning step length, measuring the corresponding drain electrode current, until the drain electrode current is less than the target current for the first time, then returning the gate electrode voltage corresponding to the minimum drain electrode current which is greater than or equal to the target current, taking the gate electrode voltage as the current scanning step length, simultaneously returning the drain electrode current corresponding to the scanning cut-in voltage, the maximum drain electrode current which is less than the target current in the scanning, the corresponding gate electrode voltage, and executing step B01;

step B05, calculating the cut-in voltage according to the cut-in voltage returned by the last scanning result, the corresponding drain current, the maximum drain electrode current which is less than the target current, and the corresponding gate electrode voltage.

Preferably, in step B01, shortening the current scanning step length includes multiplying the scanning step length by a shortening coefficient, the shortening coefficient $\lambda$ is subject to the range $0<\lambda<1$.

Preferably, the shortening coefficient $\lambda$ is $1/10$.

Preferably, step B04 further includes: after each change of the gate electrode voltage, comparing the changed gate electrode voltage to a voltage lower limit, if the changed gate electrode voltage is less than the voltage lower limit, returning an error.

Preferably, the voltage lower limit is set to be 2 times of an initial scanning gate electrode voltage.

Preferably, step B03 further includes: after each change of the gate electrode voltage, comparing the changed gate electrode voltage to a voltage upper limit, if the changed gate electrode voltage is greater than the voltage upper limit, returning an error.

Preferably, the voltage upper limit is set to be 2 times of the maximum scanning gate electrode voltage.

Preferably, the step of calculating the cut-in voltage according to the cut-in voltage returned by the last scanning result, the corresponding drain current, the maximum drain electrode current which is less than the target current, and the corresponding gate electrode voltage, is directly returning the scanning cut-in voltage of the last scanning as the cut-in voltage, or calculating via the following formula:

$$K=(Id2-Id1)/Vgstep$$

$$B=(Vg2*Id1-Vg1*Id2)/Vgstep$$

the Rslt=P*(Itarget−B)/K is returned as the cut-in voltage; wherein the field effect transistor is a P-type transistor, the value of P is −1, when the field effect transistor is a N-type transistor, the value of P is 1, Vg2 represents the scanning cut-in voltage obtained by the last scanning, Id2 represents the drain electrode current corresponding to the Vg2, Id1 represents the maximum drain electrode current value which is less than the target current at the last scanning, Vg1 represents the gate electrode voltage corresponding to Id1, Vgstep represents the scanning step length at the last scanning, Itarget represents the target current.

The invention further discloses a test system for cut-in voltage, including:

a coarse scanning module, configured for determining a scanning cut-in voltage at a coarse scanning step length;

an accurate scanning, configured for conducting a scanning taking a shortened scanning step length as current scanning step length, which is on basis of the scanning cut-in voltage corresponding to previous scanning step length, determining the scanning voltage corresponding to the shortened scanning step length; shortening the scanning step length continuously and conducting the scanning accordingly, until the previous scanning step length is shorter than a preset step length, and calculating a cut-in voltage according to the last scanning result;

wherein the scanning voltage is a minimum gate electrode voltage which allows the drain electrode current to be greater than the gate electrode current value at the current scanning step length.

In the technical solution according to the invention, the test value of the cut-in voltage is permitted to be more effective and accuracy, by adding a high resolution and accuracy test inversion to the accurate scanning test step, and increasing/decreasing the scanning voltage value automatically.

DETAILED DESCRIPTION OF THE EMBODIMENTS

Embodiments of the invention are described more fully hereinafter with reference to the accompanying drawings. The various embodiments of the invention may, however, be embodied in many different forms and should not be construed as limited to the embodiments set forth herein. Rather, it should be noted that, for easily illustration, only part of apparatus/method associated with the invention are shown in the accompanying figures.

Figure 1:
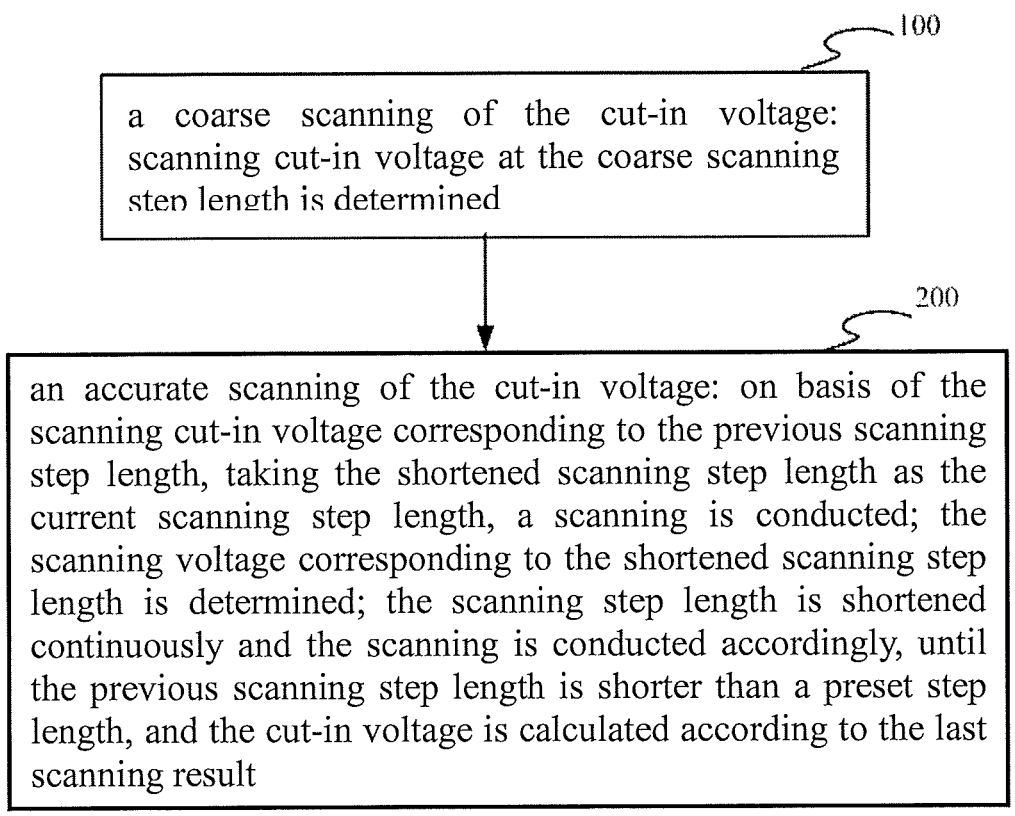
FIG. 1 is a major flowchart of a test method for cut-in voltage according to the invention.

FIG. 1 shows a major flowchart of a test method for cut-in voltage, according to the invention. As shown in FIG. 1, the method includes:

Step 100, a coarse scanning of the cut-in voltage: scanning cut-in voltage at the coarse scanning step length is determined;

Step 200, an accurate scanning of the cut-in voltage: on basis of the scanning cut-in voltage corresponding to the previous scanning step length, taking the shortened scanning step length as the present scanning step length, a scanning is conducted; the scanning voltage corresponding to the shortened scanning step length is determined; the scanning step length is shortened continuously and the scanning is conducted accordingly, until the previous scanning step length is shorter than a preset step length, and thereby the cut-in voltage is calculated according to the last scanning result.

The scanning cut-in voltage is the minimum gate electrode voltage which allows the drain electrode current value greater than the source electrode current value at the current scanning step length.

In the technical solution according to the invention, the test value of the cut-in voltage is permitted to be more effective and accuracy, by adding a high resolution and accuracy test inversion to the accurate scanning test step, thereby increasing/decreasing the scanning voltage value automatically.

Figure 2:
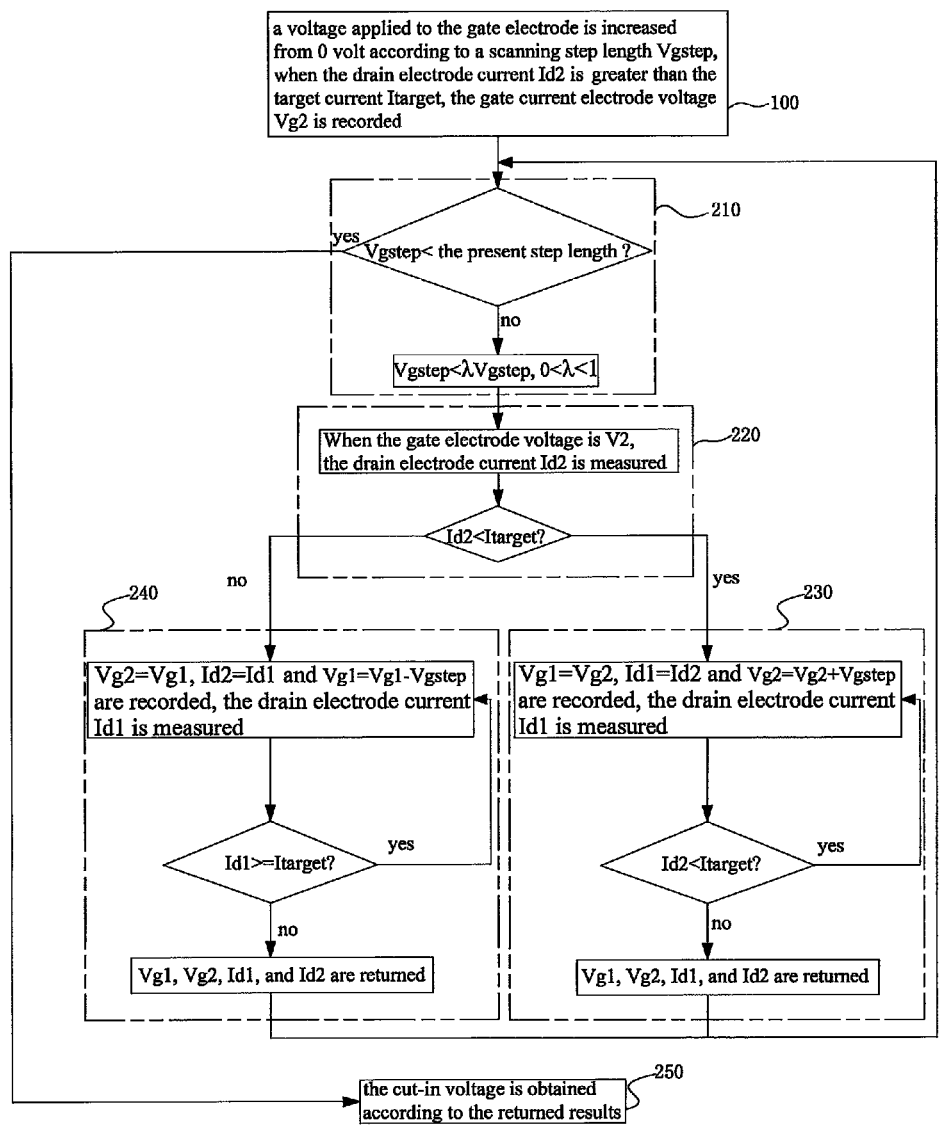
FIG. 2 is a test flowchart for cut-in voltage, according to a specific embodiment of the invention.

FIG. 2 is a test flowchart for cut-in voltage, according to a specific embodiment of the invention. As shown in FIG. 2, the method includes:

Step 100, a coarse scanning of the cut-in voltage: scanning cut-in voltage executed by the coarse scanning step length is determined;

Step 200, an accurate scanning of the cut-in voltage: on basis of the scanning cut-in voltage corresponding to the previous scanning step length, taking the shortened scanning step length as the current scanning step length, a scanning is conducted; the scanning voltage corresponding to the shortened scanning step length is determined; the scanning step length is shortened continuously and the scanning is conducted accordingly, until the previous scanning step length is shorter than a preset step length, and the cut-in voltage is calculated according to the last scanning result.

The step 200 specifically includes:

Step 210: the previous scanning step length Vgstep and the preset step length are compared, when the previous scanning step length Vgstep is greater than or equal to the preset step length, then the current scanning step length Vgstep is shortened; when the previous scanning step length Vgstep is less than the preset step length, then the following step 250 is executed. The less the step length, the higher the accuracy.

Step 220, when the drain electrode voltage is the scanning cut-in voltage Vg2 corresponding to the previous scanning step length, the drain electrode current Id2 is measured again. The drain electrode current Id2 and the target current Itarget are compared, when the Id2 is less than the Itarget, step 230 is executed; if else, step 240 is executed subsequently.

Step 230, Vg1=Vg2 and Id1=Id2 are recorded, i.e. employing Vg1 and Id1 to record a relative small gate electrode voltage and drain electrode voltage of the previous detection. Taking Vg2 as the current gate electrode voltage, detection is conducted. The gate electrode voltage is adjusted according to Vg2=Vg2+Vgstep, and the corresponding drain electrode current Id2 is measured. When the drain electrode current Id2 is greater than the target current Itarget, the Vg1, Vg2, Id1 and Id2 are returned, and step 210 is executed subsequently.

At this time, Vg2 and Id2 are the scanning cut-in voltage and the drain electrode current corresponding to the scanning cut-in voltage. Id1 and Vg1 are the previous adjustment of the gate electrode. Actually, they are the maximum drain electrode current value which is less than the target current in the current scanning, and the gate electrode voltage corresponding to the drain electrode current, respectively.

Step 240, Vg2=Vg1 and Id2=Id1 are recorded, i.e. employing Vg2 and Id2 to record a relative greater gate electrode voltage and drain electrode voltage of previous detection. Taking Vg1 as the current gate electrode voltage, detection is conducted. The gate electrode voltage is adjusted according to Vg1=Vg1−Vgstep, and the corresponding drain electrode current Id1 is measured. When the drain electrode current Id1 is less than the target current Itarget, the Vg1, Vg2, Id1 and Id2 are returned, and step 210 is executed subsequently.

At this time, because Id1 is the drain electrode current value which is less than the target current for the first time, therefore, Vg2 and Id2, as the gate electrode voltage and the drain electrode current in the previous detection. Id2 is definitely the minimum drain electrode current value which is greater than the target current value. Therefore, Vd2 is the minimum drain electrode voltage value when the drain electrode current at the current scanning step is greater than the target current value, Vd2 can be served as the scanning cut-in voltage of the current scanning. Actually, Vg1 and Id1 are the maximum drain electrode current which is less than the target current in the current scanning, and the gate electrode voltage corresponding to the drain electrode, respectively.

Step 250, the cut-in voltage is acquired, according to the returned result.

Actually, if the current jump does not emerge in the measuring process. The drain electrode current corresponding to the scanning cut-in voltage obtained by scanning at each scanning step length should be greater than the target current Itarget. In step 220, when the drain electrode voltage is the scanning cut-in voltage corresponding to the previous scanning step length, the drain electrode current is measured again to avoid an occurrence of current transition on the device. When the current jump emerged in the previous detection causes the drain electrode current of the scanning cut-in voltage corresponding to the scanning before previous to be less than the target current, step 230 is executed to correct the drain electrode current in the method according to the embodiment, therefore, the gate electrode voltage is increased step by step according to the shortened scanning step length, a scanning is performed to obtain a scanning cut-in voltage corresponding to the scanning step length.

Due to the adding of step 220 and step 230, an occurrence of scanning error subjected to the current transition can be avoided, the test accurate and efficiency of the cut-in voltage is greatly enhanced.

Generally, the scanning step length of the coarse scanning is far greater than the scanning step length of the accurate scanning, such that an efficiency of the coarse scanning can be enhanced.

Alternatively, in step 210, the current scanning step length can be proportionally shortened, such as Vgstep=λgstep, the shorten coefficient λ, is subject to the range: $0<\lambda<1$. λ can be 1/10, and also, the scanning can be performed by echelon, and whether the selected step length is too large can be determined automatically, thus the step length can be shortened automatically and reasonably. The step length can also be set as 0.0001

Alternatively, in step 230, further including: after each change of the Vg2, the Vg2 is compared to a voltage upper limit. When the Vg2 is greater than the voltage upper limit, the process is terminated. For example, when the voltage upper limit is set to be 2 times of Vgmax. Thereby, it can be executed efficiently, and error can be prevented timely.

Alternatively, in step 240, further including: after each change of the Vg2, the Vg2 is compared to a voltage lower limit. When the Vg2 is less than the voltage lower limit, the process is terminated. For example, when the voltage lower limit is set to be 2 times of Vgstart. Thereby, it can be executed efficiently, and error can be prevented timely.

In step 250, the returned Vg2 can be directly taken as the cut-in voltage, and a much more accurate cut-in voltage value can be acquired via the following formula:

$$K=(Id2-Id1)/Vgstep,$$

$$B=(Vg2*Id1-Vg1*Id2)/Vgstep$$

Rslt=P*(Itarget−B)/K, when the field effect transistor is a P-type transistor, the value of P is −1, when the field effect transistor is a N-type transistor, the value of P is 1

The method of the invention can be applied on UINX operation system, and is based on 4070 programming platform. In the programming platform, above-described method is written as a subprogram, the main program fragment is illustrated as follows:

```
For Vg2=Vgstart to Vgmax STEP Vgstep
  Force_w(G,P*Vg2,Vg2,1.E-6)
Measure_i(D,Id2,Icomp)
ld2=P*ld2
IF Id2>=Itatget THEN Out1
Vg1=vg2
ld1=ld2
NEXT Vg2
Out1:!
Set_adc(1,2)
Set_smu_ch(32701,1,1)
IF Id1=0 OR ld2<Itatget THEN Out2
While Vgstep>=0.0001
Vgstep=Vestep/10
Force_v(G,P*Vg2,Vg2,1.E-6)
Measure_i(D,Id2,Icomp)
Id2=P*Id2
IF Id2<Itarget THEN
      WHILE Id2<Itarget
          Vg1=Vg2
          Id1=Id2
Vg2=Vg2+Vgstep
IF Vg2>2*Vgmax THEN Out2
Force_v(G,P*Vg2,Vg2,1.E-6)
Measure_i(D,Id2,Icomp)
Id2=P*Id2
      END WHILE
      Rslt=Vg2
ELSE
      Vg1=Vg2
      Id1=Id2
WHILE Id1>=Itarget
      Vg2=Vg1
      Id2=Id1
Vg1=Vg1-Vgstep
IF Vg1<2*Vgstart THEN Out2
Force_v(G,P*Vg1,Vg1,1.E-6)
```

-continued

```
Measuret_i(D,Id1,Icomp)
Id1=P*Id1
    END WHILE
    Rslt=Vg1
END IF
END WHILE
K=(Id2-Id1)/Vgstep
B=(Vg2*Id1-Vg1*Id2)/Vgstep
IF K=0 THEN Out2
Rslt=P*(Itatget-B)/K
Rslt=PROUND(Rslt,-5)
!
Out2:!
Set_adc(0,1)
Set_smu_ch(32701,0,0)
Disable_port
Connect
SUBEND
!
```

Figure 3:
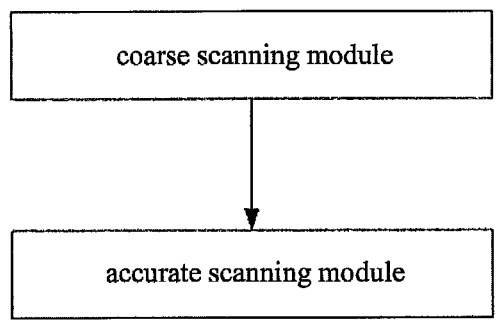
FIG. 3 is a schematically block diagram of a test system for cut-in voltage, according to a specific embodiment of the invention.

FIG. 3 is a block diagram of a test system for cut-in voltage, according to an embodiment of the invention, the test system includes:

a coarse scanning module, configured for determining the scanning cut-in voltage at the coarse scanning step length;

an accurate scanning module, configured for conducting a scanning taking a shortened scanning step length as the present scanning step length, which is on basis of the scanning cut-in voltage corresponding to the previous scanning step length, and determining the scanning voltage corresponding to the shortened scanning step length; shortening the scanning step length continuously and conducting the scanning accordingly, until the previous scanning step length is shorter than a preset step length, and calculating the cut-in voltage according to the last scanning result.

The scanning voltage is the minimum gate electrode voltage which allows the drain electrode current value to be greater than the source electrode current value at the current scanning step length.

In one embodiment, the accurate scanning module of the cut-in voltage includes:

a step length shortened module: configured for comparing the current scanning step length and the preset step length, when the current scanning step length Vgstep is greater than or equal to the preset step length, the current scanning step length Vgstep is shortened; when the drain electrode voltage is equal to Vg2, the drain electrode current Id2 is measured again. The less the step length, the higher the accuracy, for example, the new scanning step length can be obtained by proportionally shortening, Vgstep=λVgstep, alternatively, scan be 1/10.

a current comparing module, configured for comparing the drain electrode current Id2 and the target current Itarget.

a record progressive increase module, configured for recording Vg1=Vg2 and Id1=Id2, adjusting the gate electrode voltage Vg2=Vg2+Vgstep, and measuring the drain electrode current Id2, when the drain electrode current Id2 is less than the target current Itarget. When the current measured drain electrode current Id2 is greater than or equal to the target current Itarget, the record progressive increase module returns Vg1, Vg2, Id1 and Id2 to a returning module. If else, the record progressive increase module continues to work.

a record progressive decrease module, configured for recording Vg2=Vg1 and Id2=Id1, adjusting the gate electrode voltage Vg1=Vg1−Vgstep, and measuring the drain electrode current Id1, when the drain electrode current Id2 is greater than or equal to the target current Itarget. When the current measured drain electrode current Id1 is less than the target current Itarget, the record progressive decrease module returns Vg1, Vg2, Id1 and Id2 to the returning module. If else, the record progressive decrease module continues to work.

a returning module, configured for acquiring a cut-in voltage according to the returned result, when the current scanning step length is less than the preset step length.

One skilled in the art can know that when above-described method is directly written into an independent subprogram, and saved in the subprogram library, it facilitates to widely applications of subsequent test, and acquires accurate test results. When newly constructed program for the mismatch test product, all the cut-in voltage test program can select and use the subprogram to conduct a test.

The technical solution of the invention enables to conduct an accurate and efficient test, and meets a requirement of cut-in voltage test such as a mismatch test which requires a very high accuracy.

One skilled in the art can understood that, all or part of the steps of above-described examples can be implemented by using program to execute on corresponding hardware, all the program can be saved in a computer readable storage medium (such as ROM/RAM, magnetic disks; optical disks and so on).

It should be noted that, the present invention has been described with reference to the best modes and principle for carrying out the present invention, which is not intended to be limited by specific embodiment. It is apparent to those skilled in the art that a variety of modifications, changes and replacements may be made without departing from the scope of the present invention. Therefore, although the present invention is illustrated and described herein with reference to specific embodiments, the present invention is not intended to be limited to the details shown. Rather, various modifications may be made in the details within the scope and range of equivalents of the claims and without departing from the present invention.

What is claimed is:

1. A method for testing a cut-in voltage of a semiconductor performed by a testing system, comprising:
  step A, coarsely scanning the cut-in voltage, including:
    scanning voltage and current of a semiconductor at a coarse scanning step length of voltage and
    determining a scanning cut-in voltage at the coarse scanning step length of voltage; and
  step B, accurately scanning the cut-in voltage, including:
    on a basis of the scanning cut-in voltage at the coarse scanning step length of voltage, scanning the voltage and the current of the semiconductor at a shortened scanning step length of voltage than a previous scanning step length of voltage,
    determining a scanning cut-in voltage at the shortened scanning step length of voltage,
    shortening further the shortened scanning step length of voltage continuously and scanning the voltage and the current of the semiconductor at the further shortened scanning step length of voltage until the scanning step length of voltage before a last scanning step length of voltage is less than a preset step length of voltage, and
    calculating a cut-in voltage at the last scanning step length of voltage,
  wherein the scanning cut-in voltage is a minimum gate electrode voltage which allows a drain electrode current to be greater than a target current at each scanning step length of voltage.

2. The method according to claim 1, wherein step B comprises:
- step B01, determining whether the previous scanning step length of voltage is greater than the preset step length of voltage, if the previous scanning step length of voltage is greater than or equal to the preset step length of voltage, then shortening the previous scanning step length of voltage to obtain a current scanning step length and executing step B02, and if the previous scanning step length of voltage is less than the preset step length of voltage, then executing step B05;
- step B02, measuring a drain electrode current when a drain electrode voltage is the scanning cut-in voltage at the previous scanning step length of voltage, comparing the drain electrode current to the target current, if the drain electrode current is less than the target current, executing step B03, and if the drain electrode current is not less than the target current, executing step B04;
- step B03, increasing the gate electrode voltage step by step according to the current scanning step length of voltage and measuring the corresponding drain electrode current until the drain electrode current is greater than or equal to the target current for the first time, then returning, as a scanning cut-in voltage at the current scanning step length of voltage, the gate electrode voltage when the drain electrode current is greater than or equal to the target current for the first time, simultaneously returning a drain electrode current corresponding to the scanning cut-in voltage at the current scanning step length of voltage, a maximum drain electrode current which is less than the target current in the scanning, and the corresponding gate electrode voltage, and executing the step B01 again;
- step B04, decreasing the gate electrode voltage step by step according to the current scanning step length of voltage and measuring the corresponding drain electrode current until the drain electrode current is less than the target current for the first time, then returning the gate electrode voltage corresponding to a minimum drain electrode current which is greater than or equal to the target current, taking the gate electrode voltage corresponding to the minimum drain electrode current as the scanning cut-in voltage at the current scanning step length of voltage, simultaneously returning the drain electrode current corresponding to the scanning cut-in voltage at the current scanning step length of voltage, the maximum drain electrode current which is less than the target current in the step B04, and the corresponding gate electrode voltage, and executing the step B01 again; and
- step B05, calculating a cut-in voltage returned by a last scanning result, the corresponding drain current, a maximum drain electrode current which is less than the target current at the last scanning step length of voltage, and the corresponding gate electrode voltage.

3. The method according to claim 2, wherein, in the step B01, the shortening of the previous scanning step length of voltage comprises multiplying the previous scanning step length of voltage by a shortening coefficient λ, the shortening coefficient λ being subject to a range of 0<λ<1.

4. The method according to claim 3, wherein the shortening coefficient λ, is 1/10.

5. The method according to claim 2, wherein the step B04 further comprises: after each decrease of the gate electrode voltage, comparing the decreased gate electrode voltage to a voltage lower limit, if the decreased-gate electrode voltage is less than the voltage lower limit, returning an error.

6. The method according to claim 5, wherein the voltage lower limit is set to be two times of an initial scanning gate electrode voltage.

7. The method according to claim 2, wherein the step B03 further comprises: after each increase of the gate electrode voltage, comparing the increased gate electrode voltage to a voltage upper limit, if the increased gate electrode voltage is greater than the voltage upper limit, returning an error.

8. The method according to claim 7, wherein the voltage upper limit is set to be two times of the maximum gate electrode voltage at the step B03.

9. The method according to claim 2, wherein the step B05 further comprising directly returning the scanning cut-in voltage returned by the last scanning result as the cut-in voltage, or calculating via the following formula:

$K=(I_{d2}-I_{d1})/V_{gstep}$, $B=(V_{g2}*I_{d1}-V_{g1}*I_{d2})/V_{gstep}$ the $R_{slt}=P*(I_{target}-B)/K$ is returned as the cut-in voltage; wherein when the semiconductor is a P-type field effect transistor, the value of P is −1, and when the semiconductor is a N-type field effect transistor, the value of P is 1, and $V_{g2}$ represents a scanning cut-in voltage obtained by the last scanning result, $I_{d2}$ represents the drain electrode current corresponding to the $V_{g2}$, $I_{d1}$ represents the maximum drain electrode current value which is less than the target current at the last scanning, $V_{g1}$ represents the gate electrode voltage corresponding to $I_{d1}$, $V_{gstep}$ represents the scanning step length at the last scanning, and $I_{target}$ represents the target current.

10. A non-transitory computer readable storage medium including a computer program stored thereon, the computer program comprising instructions to execute a method for testing a cut-in voltage of a semiconductor which is performed by a testing system, the method comprising:
- step A, coarsely scanning the cut-in voltage, including:
  scanning a voltage and current of a semiconductor at a coarse scanning step length of voltage and determining a scanning cut-in voltage at the coarse scanning step length of voltage; and
- step B, accurately scanning the cut-in voltage, including:
  on a basis of the scanning cut-in voltage at the coarse scanning step length of voltage, scanning the voltage and current of the semiconductor at a shortened scanning step length of voltage than a previous scanning step length of voltage, determining a scanning cut-in voltage at the shortened scanning step length of voltage,
  shortening further the shortened scanning step length of voltage continuously and scanning the voltage and current of the semiconductor at the further shortened scanning step length of voltage until the scanning step length of voltage before a last scanning step length of voltage is less than a preset step length of voltage, and
  calculating a cut-in voltage at the last scanning step length of voltage, wherein the scanning cut-in voltage is a minimum gate electrode voltage which allows a drain electrode current to be greater than a target current at each scanning step length of voltage.

* * * * *